United States Patent
Chen et al.

(10) Patent No.: US 10,680,157 B2
(45) Date of Patent: Jun. 9, 2020

(54) DRIVING SYSTEM FOR PIEZOELECTRIC PUMP

(71) Applicant: Microjet Technology Co., Ltd., Hsinchu (TW)

(72) Inventors: Shih-Chang Chen, Hsinchu (TW); Jia-Yu Liao, Hsinchu (TW); Chi-Feng Huang, Hsinchu (TW); Wei-ming Lee, Hsinchu (TW); Yung-Lung Han, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 477 days.

(21) Appl. No.: 15/782,514

(22) Filed: Oct. 12, 2017

(65) Prior Publication Data

US 2018/0108825 A1    Apr. 19, 2018

(30) Foreign Application Priority Data

Oct. 13, 2016 (TW) ............................... 105133014 A

(51) Int. Cl.
| | | |
|---|---|---|
| *H01L 41/04* | (2006.01) | |
| *F04B 17/00* | (2006.01) | |
| *F04B 49/06* | (2006.01) | |
| *F04B 43/04* | (2006.01) | |
| *H02N 2/06* | (2006.01) | |

(52) U.S. Cl.
CPC .......... *H01L 41/042* (2013.01); *F04B 17/003* (2013.01); *F04B 49/06* (2013.01); *F04B 49/065* (2013.01); *F04B 43/046* (2013.01); *H02N 2/06* (2013.01)

(58) Field of Classification Search
CPC ...... F04B 43/095; F04B 49/06; F04B 49/065; F04B 49/08; H01L 41/042
See application file for complete search history.

(56) References Cited

U.S. PATENT DOCUMENTS

| | | | |
|---|---|---|---|
| 2005/0219288 A1* | 10/2005 | Vogeley | ............... F04B 43/0081 347/10 |
| 2012/0046520 A1 | 2/2012 | Augarten et al. | |
| 2015/0022056 A1 | 1/2015 | Glaser et al. | |
| 2018/0106245 A1* | 4/2018 | Chen | .................... F04B 35/045 |
| 2019/0376014 A1* | 12/2019 | Efimov | ................... C12M 41/18 |

* cited by examiner

*Primary Examiner* — J. San Martin
(74) *Attorney, Agent, or Firm* — Birch, Stewart, Kolasch & Birch, LLP

(57) ABSTRACT

A driving system includes a voltage conversion module, a switching module, a detecting module, a voltage dividing module and a microcontroller. The voltage conversion module converts a first DC voltage into a second DC voltage. The switching module converts the second DC voltage into an AC voltage so as to drive a piezoelectric actuator of a piezoelectric pump. The detecting module includes a feedback circuit and a gas pressure sensor, wherein the feedback circuit detects an electric power reference value of the switching module, and the gas pressure sensor detects the gas pressure value of the piezoelectric pump. The microcontroller acquires a working frequency according to the electric power reference value so as to operate the piezoelectric actuator at the working frequency. The microcontroller controls the voltage conversion module to adjust the output voltage. Consequently, a gas pressure in the piezoelectric pump is correspondingly adjusted.

13 Claims, 3 Drawing Sheets

DRIVING SYSTEM FOR PIEZOELECTRIC PUMP

FIELD OF THE INVENTION

The present invention relates to a driving system, and more particularly to a driving system for providing a variable output voltage and controlling a variable working frequency of a piezoelectric actuator of a piezoelectric pump.

BACKGROUND OF THE INVENTION

During operation of a piezoelectric pump, a driving system provides electric energy to drive a piezoelectric actuator of the piezoelectric pump. Consequently, the piezoelectric actuator performs a cyclic action to drive the operation of the piezoelectric pump.

Conventionally, there are three kinds of driving systems for driving the piezoelectric pump. The first driving system provides a fixed output voltage and controls a fixed working frequency of the piezoelectric actuator; the second driving system provides a variable output voltage and controls a fixed working frequency of the piezoelectric actuator; and the third driving system provides a fixed output voltage and controls a variable working frequency of the piezoelectric actuator.

However, the above-mentioned driving systems have drawbacks respectively. Regarding the first driving system, each piezoelectric pump actually has different characteristic due to different design of structure, size, thickness of the piezoelectric plate, or assembling tolerance. As a result, when being applied to the fixed output voltage and being operated at the fixed frequency, piezoelectric pumps would output different gas pressure. Thus, the first driving system causes difficulty in precisely control the performance and the output flowrate of different piezoelectric pumps.

Regarding the second driving system, the problem is poor compatibility. As mentioned, the structure design and the thickness of the piezoelectric plate affect physical characteristics of piezoelectric pumps, so each type of piezoelectric pumps has an optimal working frequency. However, the second driving system fails to operate the different types of piezoelectric pumps at their optimal working frequencies. For instance, the optimal working frequencies of three different kinds of piezoelectric pumps are 100 kHz, 105 kHz, and 95 kHz respectively. The second driving system controls the piezoelectric actuators of these three kinds of piezoelectric pumps to work at a fixed working frequency, which is approximately average of their optimal working frequencies, e.g., 100 kHz. Under this circumstance, a higher voltage or a lower voltage is required to drive the piezoelectric pumps that have the optimal working frequencies of 105 kHz and 95 kHz. However, if the output voltage is too high, the piezoelectric property of the piezoelectric actuator may be lost and thus the piezoelectric pump is damaged.

Regarding the third driving system, it results in the abrupt increase or decrease of the performance of the piezoelectric pump and narrows the range of the controllable working frequency of the piezoelectric pump. Thus, applicability of the third driving system is quite limited.

Therefore, there is a need of providing an improved driving system for a piezoelectric pump in order to overcome the above drawbacks.

SUMMARY OF THE INVENTION

An object of the present invention is to provide a driving system for a piezoelectric pump in order to overcome the drawbacks of the conventional technologies. As previously described, the driving system providing the fixed frequency and the fixed voltage, the driving system providing the fixed frequency and the variable voltage, as well as the driving system providing the variable frequency and the fixed voltage, all have respective drawbacks. For example, the performance and the output flowrate of the piezoelectric pump are not precisely controlled, the piezoelectric pump is easily damaged, or having poor applicability upon different types of piezoelectric pumps. For solving the above drawbacks, the driving system of the present invention provides a variable output voltage and controls a variable working frequency of the piezoelectric actuator, consequently providing improved compatibility, usability and performance.

In accordance with an aspect of the present invention, there is provided a driving system for driving a piezoelectric actuator of a piezoelectric pump. The driving system includes a voltage conversion module, a switching module, a detecting module, a voltage dividing module, and a microcontroller. A first DC voltage generated by a power source is converted into a second DC voltage by the voltage conversion module. The switching module is electrically connected with the voltage conversion module and the piezoelectric actuator, converting the second DC voltage into an AC voltage so as to drive the piezoelectric actuator. The detecting module includes a feedback circuit and a gas pressure sensor, wherein the feedback circuit is electrically connected with the switching module, and the gas pressure sensor is configured to detect a gas pressure of the piezoelectric pump and accordingly generate a detected gas pressure value. The voltage dividing module is electrically connected with the voltage conversion module. The microcontroller is electrically connected with the voltage dividing module, the switching module, the feedback circuit, and the gas pressure sensor. The microcontroller implements the following actions: issuing a driving signal to operate the switching module in a range of frequencies; acquiring at least one electric power reference value from the feedback circuit, wherein the electric power reference value corresponds to the operation of the switching module at the range of frequencies; acquiring a working frequency of the AC voltage according to the electric power reference value and operating the piezoelectric actuator at the working frequency; acquiring an actual gas pressure change amount of the piezoelectric pump within a specified time interval by calculating the detected gas pressure values; issuing an adjusting signal to the voltage conversion module through the voltage dividing module according to a result of comparing the actual gas pressure change amount with a predetermined gas pressure change amount. The voltage conversion module adjusts the second DC voltage according to the adjusting signal, so that the gas pressure of the piezoelectric pump is correspondingly adjusted to make the actual gas pressure change amount approaching to the predetermined gas pressure change amount.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
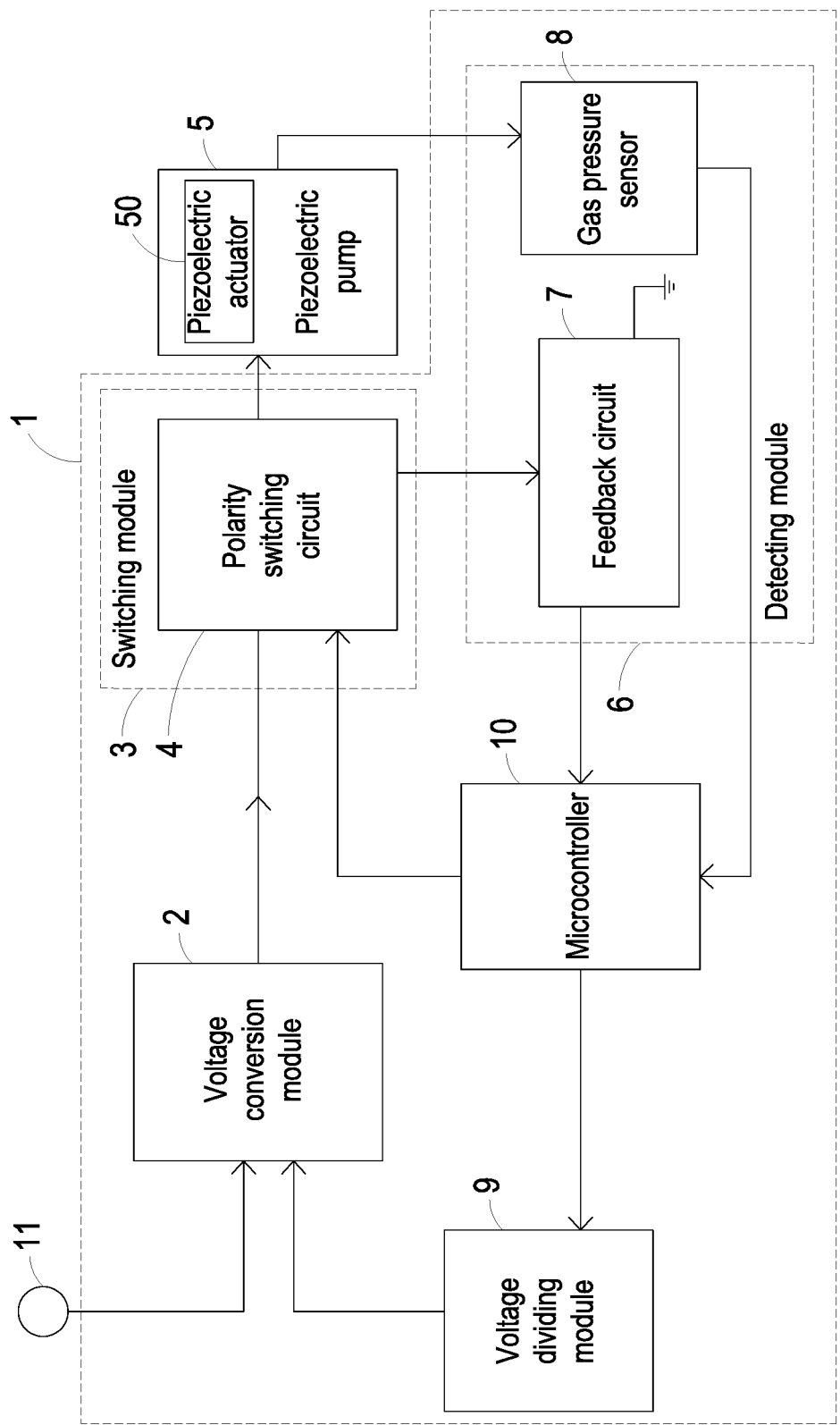
FIG. 1 is a schematic circuit block diagram illustrating a driving system according to an embodiment of the present invention.

FIG. 1 is a schematic circuit block diagram illustrating a driving system according to an embodiment of the present invention. As shown in FIG. 1, the driving system 1 is used for driving a piezoelectric actuator 50 of a piezoelectric pump 5. In this embodiment, the driving system 1 comprises a voltage conversion module 2, a switching module 3, a detecting module 6, a voltage dividing module 9 and a microcontroller 10.

The voltage conversion module 2 has an input terminal and an output terminal. After receiving a first DC voltage generated by a power source 11 via the input terminal, the voltage conversion module 2 converts the first DC voltage into a second DC voltage and outputs the second DC voltage from the output terminal.

The switching module 3 is electrically connected between the voltage conversion module 2 and the piezoelectric pump 5, receiving the second DC voltage from the voltage conversion module 2 and converting it into an AC voltage for applying to the piezoelectric actuator 50 of the piezoelectric pump 5. Consequently, the piezoelectric pump 5 is actuated.

The detecting module 6 comprises a feedback circuit 7 and a gas pressure sensor 8. The feedback circuit 7 is electrically connected with the switching module 3. The gas pressure sensor 8 is configured to close or to be inside the piezoelectric pump 5 so as to detect the gas pressure of the piezoelectric pump 5 and accordingly generates a detected gas pressure value.

The voltage dividing module 9 is electrically connected between the voltage conversion module 2 and the microcontroller 10, dividing the voltages of output signals from the microcontroller 10 and providing the processed signals to the voltage conversion module 2.

The microcontroller 10 is electrically connected with the voltage dividing module 9, the switching module 3, the feedback circuit 7 and the gas pressure sensor 8. The microcontroller 10 issues a driving signal to operate the switching module 3 at a specified range of frequencies. During operation of the switching module 3 at said range of frequencies, the microcontroller 10 acquires one or more corresponding electric power reference values through the feedback circuit 7. The microcontroller 10 defines a working frequency corresponding to the AC voltage according to the electric power reference values, and operates the piezoelectric actuator 50 at such working frequency.

More specifically, the microcontroller 10 may acquire plural electric power reference values, each of which can be a voltage reference value related to the voltage of the switching module 3 while working at the range of frequencies. Similarly, each of the electric power reference values also can be a current reference value related to the current of the switching module 3 while working at the range of frequencies.

The microcontroller 10 decides a maximum one of the electric power reference values, and defines the frequency corresponding to the maximum electric power reference value as the working frequency. Consequently, the switching module 3 is operated at such working frequency to convert the second DC voltage into the AC voltage at such working frequency so as to drive the operation of the piezoelectric actuator 50.

Moreover, a predetermined gas pressure change amount is previously stored in the microcontroller 10. By calculating the detected gas pressure values from the gas pressure sensor 8 within a specified time interval, the microcontroller 10 acquires an actual gas pressure change amount of the piezoelectric pump 5 within the specified time interval. Moreover, the microcontroller 10 issues an adjusting signal to the voltage dividing module 9 according to a result of comparing the actual gas pressure change amount with the predetermined gas pressure change amount. Preferably but not exclusively, the adjusting signal is a pulse width modulation (PWM) signal. After the adjusting signal is subjected to voltage division by the voltage dividing module 9, the voltage-divided adjusting signal is sent to the voltage conversion module 2 by which the second DC voltage is accordingly adjusted. Since the gas pressure in the piezoelectric pump 5 is correspondingly adjusted, the actual gas pressure change amount is approaching to the predetermined gas pressure change amount.

To sum up, the piezoelectric actuator 50 is controlled to be operated at a specific working frequency decided by the microcontroller 10. The microcontroller 10 issues the driving signal to operate the switching module 3 at a specified range of frequencies, then defining a frequency corresponding to the maximum voltage or the maximum current as the working frequency. Consequently, the driving system 10 is capable of adjusting the working frequency to match the characteristics of the piezoelectric actuator 50. In other words, the working frequency is variable. Moreover, the microcontroller 10 generates the adjusting signal according to the result of comparing the actual gas pressure change amount with the predetermined gas pressure change amount. The voltage conversion module adjusts the second DC voltage according to the adjusting signal, as a result, the gas pressure in the piezoelectric pump 5 is correspondingly adjusted, and the actual gas pressure change amount is adjusted to be close to the predetermined gas pressure change amount. Although each piezoelectric pump 5 has different characteristic and structure, the driving system 1 of the present invention is still capable of adjusting its actual gas pressure change amount to be close to a predetermined gas pressure change amount. Thus, the present invention has better applicability than conventional technologies. Since the driving system 1 is able to output variable voltage to the piezoelectric actuator 50 and operate the piezoelectric actuator 50 at variable working frequency, the driving system 1 of the present invention can precisely control the performance and the output flowrate of the piezoelectric pump 5. Meanwhile, the driving system 1 avoids the damage of the piezoelectric pump 5 as well as increasing its applicability. Thus, the driving system 10 of the present invention can overcome the drawbacks of the conventional technologies.

Figure 2:
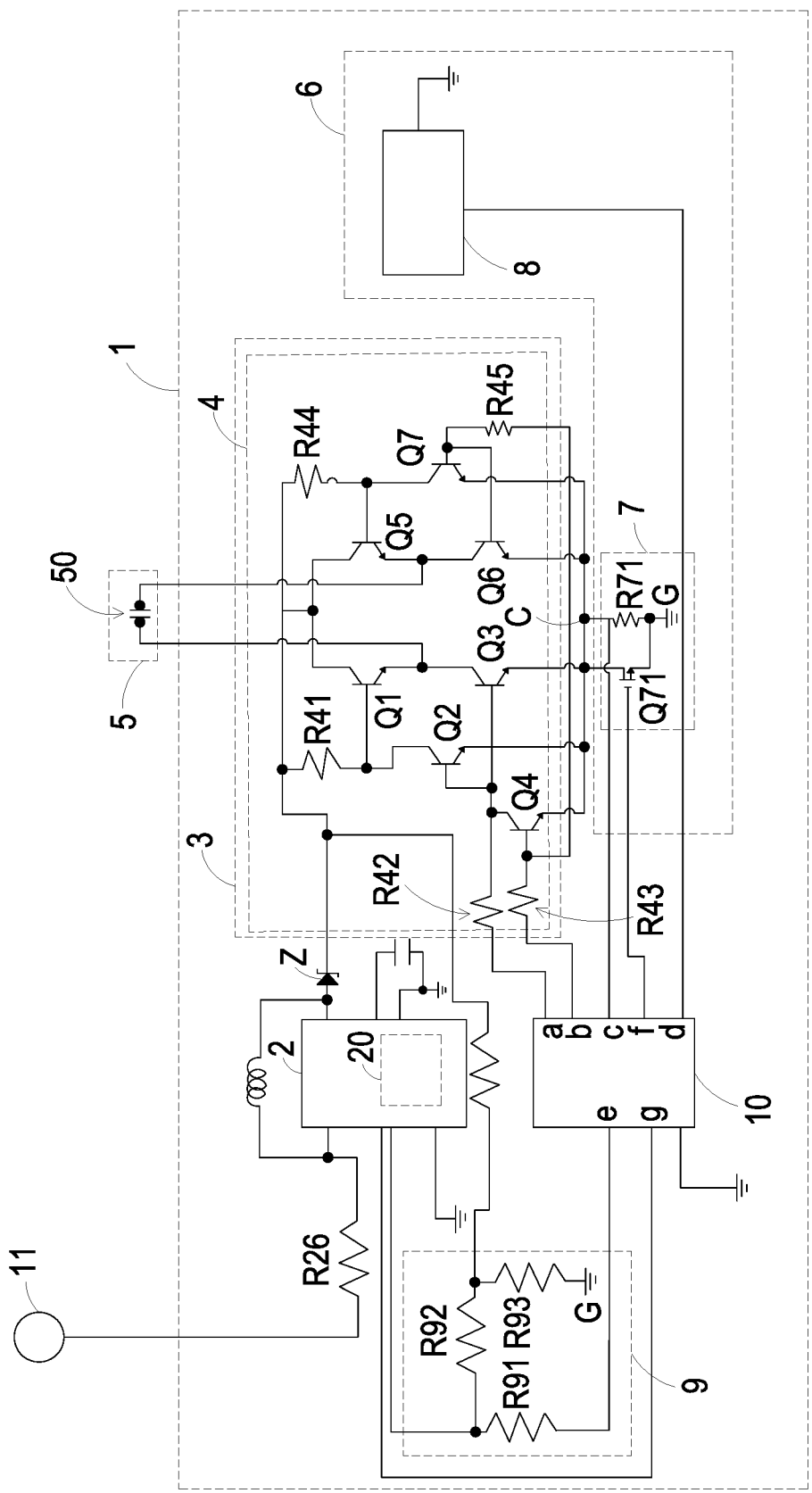
FIG. 2 is a schematic circuit diagram illustrating the detailed circuitry of the driving system of FIG. 1.

FIG. 2 is a schematic circuit diagram illustrating the detailed circuitry of the driving system of FIG. 1. As shown in FIG. 2, the switching module 3 comprises a polarity switching circuit 4. The polarity switching circuit 4 comprises a first resistor R41, a second resistor R42, a third resistor R43, a fourth resistor R44, and a fifth resistor R45. Furthermore, the polarity switching circuit 4 comprises a first transistor switch Q1, a second transistor switch Q2, a third transistor switch Q3, a fourth transistor switch Q4, a fifth transistor switch Q5, a sixth transistor switch Q6 and a seventh transistor switch Q7.

A first terminal of the first resistor R41 is electrically connected with the output terminal of the voltage conversion module 2 to receive the second DC voltage. The collector of the first transistor switch Q1 is electrically connected with the first terminal of the first resistor R41. The base of the first transistor switch Q1 is electrically connected with a second terminal of the first resistor R41. The emitter of the first transistor switch Q1 is electrically connected with a first terminal of the piezoelectric pump 5. The collector of the second transistor switch Q2 is electrically connected with the second terminal of the first resistor R41 and the base of the first transistor switch Q1. The emitter of the second transistor switch Q2 is electrically connected with a common node C. The collector of the third transistor switch Q3 is electrically connected with the first terminal of the piezoelectric pump 5 and the emitter of the first transistor switch Q1. The base of the third transistor switch Q3 is electrically connected with the base of the second transistor switch Q2. The emitter of the third transistor switch Q3 is electrically connected with the common node C. The collector of the fourth transistor switch Q4 is electrically connected with the base of the second transistor switch Q2 and the base of the third transistor switch Q3. The emitter of the fourth transistor switch Q4 is electrically connected with the common node C. A first terminal of the second resistor R42 is electrically connected with the base of the second transistor switch Q2, the base of the third transistor switch Q3 and the collector of the fourth transistor switch Q4. A first terminal of the third resistor R43 is electrically connected with the base of the fourth transistor switch Q4. A first terminal of the fourth resistor R44 is electrically connected with the collector of the first transistor switch Q1 and the first terminal of the first resistor R41. The collector of the fifth transistor switch Q5 is electrically with the first terminal of the first resistor R41 and the first terminal of the fourth resistor R44. The base of the fifth transistor switch Q5 is electrically with a second terminal of the fourth resistor R44. The emitter of the fifth transistor switch Q5 is electrically with a second terminal of the piezoelectric pump 5. The collector of the sixth transistor switch Q6 is electrically connected with the emitter of the fifth transistor switch Q5 and the second terminal of the piezoelectric pump 5. The emitter of the sixth transistor switch Q6 is electrically connected with the common node C. The collector of the seventh transistor switch Q7 is electrically connected with the base of the fifth transistor switch Q5 and the second terminal of the fourth resistor R44. The base of the seventh transistor switch Q7 is electrically connected with the base of the sixth transistor switch Q6. The emitter of the seventh transistor switch Q7 is electrically connected with the common node C. A first terminal of the fifth resistor R45 is electrically connected with the base of the sixth transistor switch Q6 and the base of the seventh transistor switch Q7. A second terminal of the fifth resistor R45 is electrically connected with the first terminal of the third resistor R43 and the base of the fourth transistor switch Q4.

The feedback circuit 7 comprises a sixth resistor R71. A first terminal of the sixth resistor R71 is electrically connected with the common node C, and a second terminal of the sixth resistor R71 is electrically connected with a ground terminal. The sixth resistor R71 is adapted to detect electric power at the common terminal C and generate an electric power detection signal. That is, the voltage or the current at the common terminal C is the electric power reference value of the switching module 3.

The microcontroller 10 issues the driving signal which contains a first sub-driving signal and a second sub-driving signal for controlling the operations of the polarity switching circuit 4. The microcontroller 10 comprises a first terminal "a", a second terminal "b", a third terminal "c", a fourth terminal "d", and a fifth terminal "e". The first terminal "a" is electrically connected with a second terminal of the second resistor R42 to output the first sub-driving signal. The second terminal "b" is electrically connected with a second terminal of the third resistor R43 to output the second sub-driving signal. The third terminal "c" is electrically connected with the first terminal of the sixth resistor R71 of the feedback circuit 7 to receive the electric power reference value. The fourth terminal "d" is electrically connected with the gas pressure sensor 8 to receive the detected gas pressure value. The fifth terminal "e" is electrically connected with the voltage dividing module 9 to output the adjusting signal.

The voltage dividing module 9 comprises a seventh resistor R91, an eighth resistor R92 and a ninth resistor R93. A first terminal of the seventh resistor R91 is electrically connected with the fifth terminal "e" of the microcontroller 10. A first terminal of the eighth resistor R92 and a second terminal of the seventh resistor R91 are electrically connected with the input terminal of the voltage conversion module 2. A first terminal of the ninth resistor R93 is electrically connected with a second terminal of the eighth resistor R92. A second terminal of the ninth resistor R93 is electrically connected with a ground terminal G.

In an embodiment of the present invention, the microcontroller 10 further comprises a sixth terminal "f" for outputting a bypass signal, and the feedback circuit 7 further comprises a bypass switch Q71. The bypass switch Q71 is electrically connected between the common terminal C and the ground terminal G Meanwhile, the bypass switch Q71 is connected in parallel with the sixth resistor R71. Moreover, a control terminal of the bypass switch Q71 is electrically connected with the sixth terminal "f" of the microcontroller 10 from which the bypass switch Q71 receives a bypass signal. According to the bypass signal, the bypass switch Q71 is selectively turned on or turned off. Only when the piezoelectric actuator 50 is operating at the working frequency corresponding to the electric power reference value related to the maximum voltage or the maximum current, the microcontroller 10 would issue the bypass signal to turn on the bypass switch Q71. In the other situation, the microcontroller 10 issues the bypass signal to turn off the bypass switch Q71 for not unnecessarily consuming the electric power.

In an embodiment of the present invention, the second DC voltage from the voltage conversion module 2 is controlled by the microcontroller 10 in a nonrevertive control manner, which means the adjusting signal from the microcontroller 10 is at a voltage that is directly proportional to the second DC voltage from the voltage conversion module. In other words, as the voltage level of the adjusting signal increases, the voltage level of the second DC voltage also increases. In another embodiment, the second DC voltage from the voltage conversion module 2 is controlled by the microcontroller 10 in a revertive control manner, which means the adjusting signal from the microcontroller 10 is at a voltage that is inversely proportional to the second DC voltage from the voltage conversion module. In other words, as the voltage level of the adjusting signal decreases, the voltage level of the second DC voltage increases oppositely.

Please refer to FIG. 2 again. In some embodiments, the microcontroller 10 further comprises a seventh terminal "g" electrically connected with the voltage conversion module 2. The microcontroller 10 selectively enables or disables the voltage conversion module 2 in order to achieve the power-saving purpose. For example, the microcontroller 10 disables the voltage conversion module 2 when the microcontroller 10 receives a control command or judges that the actual gas pressure change amount is equal to the predetermined gas pressure change amount.

The driving system 1 further comprises a current-limiting resistor R26 and a Schottky diode Z. The current-limiting resistor R26 is electrically connected between the power source 11 and the input terminal of the voltage conversion module 2. The anode of the Schottky diode Z is electrically connected with the output terminal of the voltage conversion module 2, and the cathode of the Schottky diode Z is electrically connected with the switching module 3. The Schottky diode Z is used for preventing the reverse current from flowing into the voltage conversion module 2.

Figure 3:
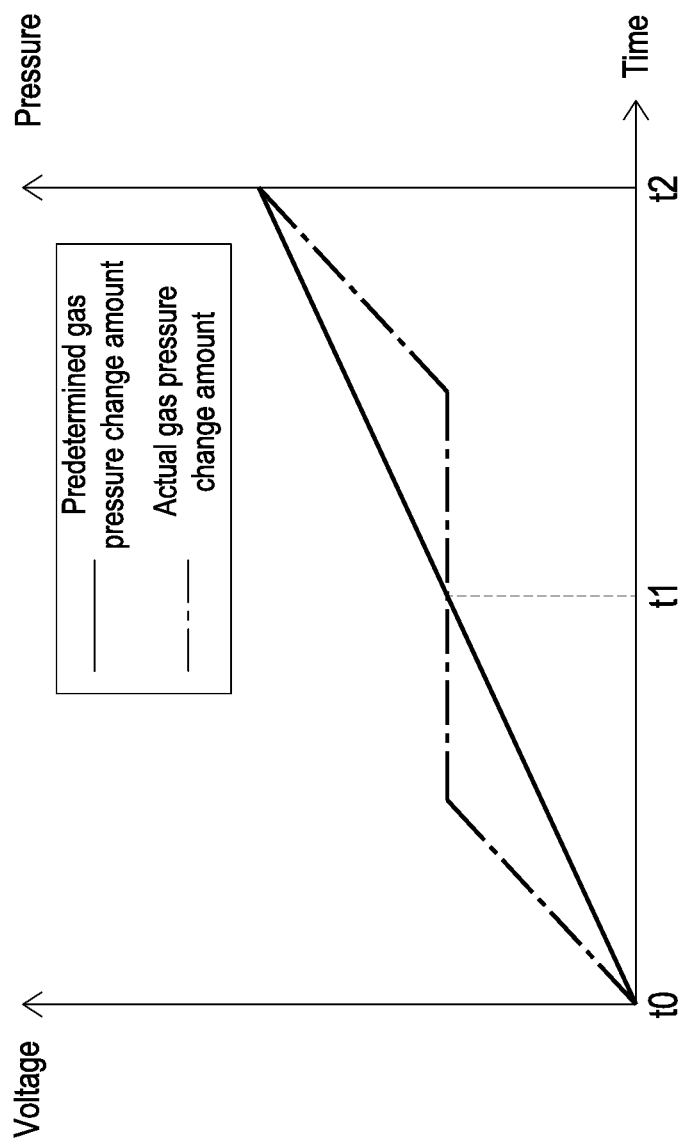
FIG. 3 is a plot illustrating the relationship between the actual gas pressure change amount and the predetermined gas pressure change amount.

FIG. 3 is a plot illustrating the relationship between the actual gas pressure change amount and the predetermined gas pressure change amount. From calculating the detected gas pressure values from the gas pressure sensor 8, the microcontroller 10 obtains an actual gas pressure change amount of the piezoelectric pump 5 within a specified time interval (e.g., the time interval between t0 and t1 and the time interval between t1 and t2). Moreover, the microcontroller 10 issues the adjusting signal according to the result of comparing the actual gas pressure change amount with the predetermined gas pressure change amount, therefore making the former approaching to the latter. For example, within the time interval between t0 and t1, the actual gas pressure change amount is greater than the predetermined gas pressure change amount. As a result, the microcontroller 10 issues the adjusting signal to control the voltage conversion module 2 to decrease the second DC voltage. Consequently, the actual gas pressure change amount is adjusted to be close to the predetermined gas pressure change amount. Moreover, within the time interval between t1 and t2, the actual gas pressure change amount is less than the predetermined gas pressure change amount. As a result, the microcontroller 10 issues the adjusting signal to control the voltage conversion module 2 to increase the second DC voltage. Consequently, the actual gas pressure change amount is adjusted to be close to the predetermined gas pressure change amount.

The operations of the driving system 1 will be described as follows. In a first step, the microcontroller 10 issues a driving signal. According to the driving signal, the piezoelectric actuator 50 is operated at a specified range of frequencies. Then, through the feedback circuit 7, the microcontroller 10 acquires the electric power reference values respectively corresponding to each of the specified range of frequencies. One of the frequencies corresponding to the maximum electric power reference value is defined as the working frequency. In a second step, the microcontroller 10 judges whether the actual gas pressure change amount complies with the predetermined gas pressure change amount. If the judging condition of the second step is satisfied, the second step is repeatedly done. Whereas, if the judging condition of the second step is not satisfied, a third step is performed to judge whether the actual gas pressure change amount is greater than the predetermined gas pressure change amount. If the judging condition of the third step is satisfied, a fourth step is performed. In the fourth step, the microcontroller 10 issues the adjusting signal to control the voltage conversion module 2 to decrease the second DC voltage. After the fourth step, the second step is carried out again. If the judging condition of the third step is not satisfied, a fifth step is performed. In the fifth step, the microcontroller 10 issues the adjusting signal to control the voltage conversion module 2 to increase the second DC voltage. After the fifth step, the second step is carried out again.

From the above descriptions, the present invention provides a driving system for driving a piezoelectric actuator of a piezoelectric pump, wherein the microcontroller can acquire the optimal working frequency through the feedback circuit. Consequently, the microcontroller controls the operation of the piezoelectric actuator at the working frequency. The microcontroller of the driving system controls the switching module to adjust the output voltage according to the difference between the actual gas pressure change amount and the predetermined gas pressure change amount. Consequently, the gas pressure in the piezoelectric pump is adjusted, and the actual gas pressure change amount is adjusted to approaching the predetermined gas pressure change amount. The driving system of the present invention is able to output the variable voltage to the piezoelectric actuator and adjusts the working frequency of the piezoelectric actuator according to the characteristics of the piezoelectric actuator. The driving system of the present invention can precisely control the performance and the output flowrate of the piezoelectric pump, avoid damage of the piezoelectric pump and increases the application of the piezoelectric pump.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A driving system for driving a piezoelectric actuator of a piezoelectric pump, the driving system comprising:
 a voltage conversion module converting a first DC voltage generated by a power source into a second DC voltage;
 a switching module electrically connected with the voltage conversion module and the piezoelectric actuator, converting the second DC voltage into an AC voltage so as to drive the piezoelectric actuator;
 a detecting module comprising a feedback circuit and a gas pressure sensor, wherein the feedback circuit is electrically connected with the switching module, and the gas pressure sensor is configured to detect a gas pressure of the piezoelectric pump and accordingly generates a detected gas pressure value;
 a voltage dividing module electrically connected with the voltage conversion module; and
 a microcontroller electrically connected with the voltage dividing module, the switching module, the feedback circuit and the gas pressure sensor, wherein the microcontroller implements actions comprising: issuing a driving signal to operate the switching module at a range of frequencies; acquiring at least one electric power reference value through the feedback circuit, wherein the electric power reference value corresponds to the operation of the switching module at the range of frequencies; acquiring a working frequency of the AC voltage according to the electric power reference value and operating the piezoelectric actuator at the working frequency; acquiring an actual gas pressure change amount of the piezoelectric pump within a specified time interval by calculating the detected gas pressure values; and issuing an adjusting signal to the voltage conversion module through the voltage dividing module according to a result of comparing the actual gas pressure change amount with a predetermined gas pressure change amount;

wherein the voltage conversion module adjusts the second DC voltage according to the adjusting signal, so that the gas pressure of the piezoelectric pump is correspondingly adjusted to make the actual gas pressure change amount approaching to the predetermined gas pressure change amount.

2. The driving system according to claim 1, wherein the switching module comprises a polarity switching circuit, and the polarity switching circuit comprises:

a first resistor, wherein a first terminal of the first resistor is electrically connected with the voltage conversion module to receive the second DC voltage;

a first transistor switch, the collector of which is electrically connected with the voltage conversion module and the first terminal of the first resistor, and the base of which is electrically connected with the second terminal of the first resistor;

a second transistor switch, the collector of which is electrically connected with the base of the first transistor switch and the second terminal of the first resistor, and the emitter of which is electrically connected with a common node;

a third transistor switch, the collector of which is electrically connected with the emitter of the first transistor switch and a first terminal of the piezoelectric pump, the base of the which is electrically connected with the base of the second transistor switch, and the emitter of which is electrically connected with the common node;

a fourth transistor switch, the collector of which is electrically connected with the base of the second transistor switch and the base of the third transistor switch, and the emitter of which is electrically connected with the common node;

a second resistor, wherein a first terminal of the second resistor is electrically connected with the base of the second transistor switch, the base of the third transistor switch and the collector of the fourth transistor switch;

a third resistor, wherein a first terminal of the third resistor is electrically connected with the base of the fourth transistor switch;

a fourth resistor, wherein a first terminal of the fourth resistor is electrically connected with the first terminal of the first resistor to which connected the collector of the first transistor switch;

a fifth transistor switch, the collector of which is electrically connected with the collector of the first transistor switch to which connected the first terminal of the first resistor and the first terminal of the fourth resistor, the base of which is electrically with a second terminal of the fourth resistor, and the emitter of which is electrically with a second terminal of the piezoelectric pump;

a sixth transistor switch, the collector of which is electrically connected with the emitter of the fifth transistor switch to which connected the second terminal of the piezoelectric pump, and the emitter of which is electrically connected with the common node;

a seventh transistor switch, the collector of which is electrically connected with the base of the fifth transistor switch and the second terminal of the fourth resistor, the base of which is electrically connected with the base of the sixth transistor switch, and the emitter of which is electrically connected with the common node; and a fifth resistor, wherein a first terminal of the fifth resistor is electrically connected with the base of the sixth transistor switch and the base of the seventh transistor switch, and a second terminal of the fifth resistor is electrically connected with the base of the fourth transistor switch connected to a first terminal of the third resistor.

3. The driving system according to claim 2, wherein the feedback circuit comprises a sixth resistor, wherein a first terminal of the sixth resistor is electrically connected with the common node, and a second terminal of the sixth resistor is electrically connected with a ground terminal.

4. The driving system according to claim 3, wherein the driving signal contains a first sub-driving signal and a second sub-driving signal, and the microcontroller comprises:

a first terminal electrically connected with the second terminal of the second resistor to generate the first sub-driving signal;

a second terminal electrically connected with the second terminal of the third resistor and outputting the second sub-driving signal;

a third terminal electrically connected with the first terminal of the sixth resistor to receive the at least one electric power reference value;

a fourth terminal electrically connected with the gas pressure sensor to receive the detected gas pressure value;

a fifth terminal electrically connected with the voltage dividing module to output the adjusting signal; and a sixth terminal outputting a bypass signal.

5. The driving system according to claim 4, wherein the voltage dividing module comprises:

a seventh resistor, wherein a first terminal of the seventh resistor is electrically connected with the fifth terminal of the microcontroller, and a second terminal of the seventh resistor is electrically connected with the voltage conversion module;

an eighth resistor, wherein a first terminal of the eighth resistor and the second terminal of the seventh resistor are electrically connected with the voltage conversion module; and a ninth resistor, wherein a first terminal of the ninth resistor is electrically connected with the second terminal of the eighth resistor, and a second terminal of the ninth resistor is electrically connected with the ground terminal.

6. The driving system according to claim 4, wherein the feedback circuit further comprises a bypass switch electrically connected between the common terminal and the ground terminal and is connected in parallel with the sixth resistor, wherein a control terminal of the bypass switch is electrically connected with the sixth terminal of the microcontroller to receive a bypass signal from microcontroller by which the bypass switch is to be selectively turned on or turned off.

7. The driving system according to claim 1, wherein the adjusting signal from the microcontroller is at a voltage that is directly proportional to the second DC voltage from the voltage conversion module.

8. The driving system according to claim 1, wherein the adjusting signal from the microcontroller is at a voltage that is inversely proportional to the second DC voltage from the voltage conversion module.

9. The driving system according to claim 1, wherein the adjusting signal is a pulse width modulation signal.

10. The driving system according to claim 1, wherein if the actual gas pressure change amount is greater than the predetermined gas pressure change amount, the microcontroller issues the adjusting signal to control the voltage conversion module to decrease the second DC voltage, wherein if the actual gas pressure change amount is less than the predetermined gas pressure change amount, the microcontroller issues the adjusting signal to control the voltage conversion module to increase the second DC voltage.

11. The driving system according to claim 1, wherein the microcontroller further comprises a seventh terminal, wherein the seventh terminal of the microcontroller is electrically connected with the voltage conversion module, and the voltage conversion module is enabled or disabled by the microcontroller through the seventh terminal.

12. The driving system according to claim 1, wherein the at least one electric power reference value includes at least one voltage reference value, and a frequency corresponding to the maximum one of the at least one voltage value is defined as the working frequency.

13. The driving system according to claim 1, wherein the at least one electric power reference value includes at least one current reference value, and a frequency corresponding to the maximum one of the at least one current value is defined as the working frequency.

* * * * *